United States Patent
Toyoda

(10) Patent No.: US 7,476,894 B2
(45) Date of Patent: Jan. 13, 2009

(54) ORGANIC FET HAVING IMPROVED ELECTRODE INTERFACES AND A FABRICATION METHOD THEREFOR

(75) Inventor: Kenji Toyoda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/939,098

(22) Filed: Nov. 13, 2007

(65) Prior Publication Data
US 2008/0061290 A1    Mar. 13, 2008

Related U.S. Application Data

(63) Continuation of application No. PCT/JP2007/059591, filed on May 9, 2007.

(30) Foreign Application Priority Data
May 18, 2006   (JP)   ............................. 2006-138443

(51) Int. Cl.
*H01L 29/08* (2006.01)
*H01L 35/24* (2006.01)
*H01L 51/00* (2006.01)

(52) U.S. Cl. ............................. 257/40; 438/82; 438/99; 257/E39.007

(58) Field of Classification Search .................. 257/40, 257/E39.007; 438/82, 99
See application file for complete search history.

(56) References Cited

U.S. PATENT DOCUMENTS

2005/0056897 A1   3/2005   Kawasaki et al.
2006/0108581 A1   5/2006   Matsumura et al.
2008/0067504 A1*  3/2008   Park et al. ...................... 257/40

FOREIGN PATENT DOCUMENTS

| JP | 2004-288836 | 10/2004 |
|---|---|---|
| JP | 2005-093542 | 4/2005 |
| JP | 2005-223107 | 8/2005 |
| JP | 2006-148131 | 6/2006 |

OTHER PUBLICATIONS

International Search Report, issued in International Patent Appplication No. PCT/JP2007/059591, dated on Jul. 10, 2007.

* cited by examiner

*Primary Examiner*—Phat X Cao
(74) *Attorney, Agent, or Firm*—McDermott Will & Emery LLP

(57) ABSTRACT

An organic FET in which the interfaces (electrode interfaces) between a semiconductor layer and a source electrode and between a semiconductor layer and a drain electrode are improved by employing a technique to increase ON-state current (driving current) and to reduce contact resistance. The organic FET includes a substrate; a gate insulating film disposed on the substrate; a metal source electrode and a metal drain electrode disposed on the gate insulating film in such a manner that they face each other in a horizontal direction; and an organic semiconductor layer covering the gate insulating film, the source electrode and the drain electrode, wherein a first organic molecule layer and a second organic molecule layer are formed on the interfaces (electrode interfaces) between a semiconductor layer and a source electrode and between a semiconductor layer and a drain electrode.

5 Claims, 6 Drawing Sheets

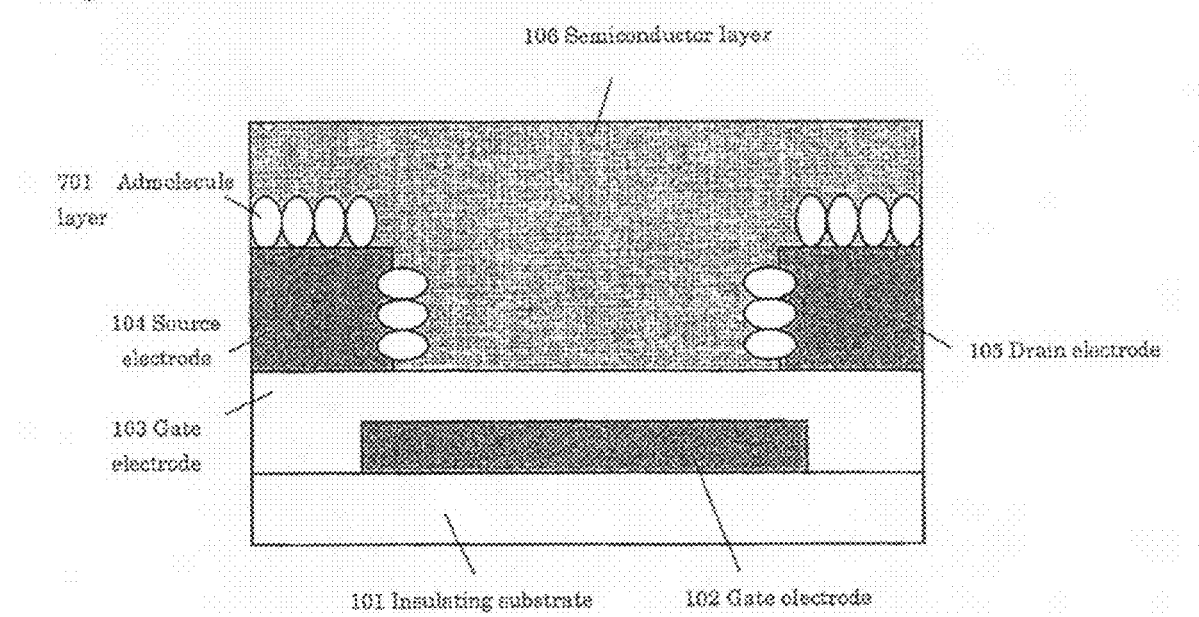

US 7,476,894 B2

ORGANIC FET HAVING IMPROVED ELECTRODE INTERFACES AND A FABRICATION METHOD THEREFOR

RELATED APPLICATIONS

This application is a Continuation Application of International Application No. PCT/JP2007/059591, filed on May 9, 2007, which in turn claims the benefit of Japanese Application No. 2006-138443, filed on May 18, 2006, the disclosures of which Applications are incorporated by reference herein.

TECHNICAL FIELD

The present invention relates to an organic FET having improved electrode interfaces and a method for producing the same. More specifically, the present invention relates to organic FETs for which interfaces (electrode interfaces) between a semiconductor layer and a source electrode and between a semiconductor layer and a drain electrode have been improved so as to increase the ON-state current (driving current) and to reduce contact resistance (resistance generated on the electrode surfaces due to contact between a metal and a semiconductor). The present invention also relates to a method for producing such organic FETs.

BACKGROUND ART

In recent years, research and development has been actively conducted on devices using organic semiconductors. Among such devices, organic electroluminescence (EL) devices are being put into practical use as display units. Organic field-effect transistors (FETs) using an organic semiconductor as an active layer have also been drawing public attention as a useful switching element. These devices using organic semiconductors are advantageous because the organic semiconductor can be obtained by a printing process at a low temperature, costs can be reduced, etc. Furthermore, such a device can be fabricated on a plastic or like flexible substrate, and it offers mechanical flexibility. Therefore, applications that differ from those of devices using conventional inorganic semiconductors are expected to be found by using these advantages.

An organic FET is equipped with three electrodes, i.e., a gate, a source, and a drain, in the same manner as a device in which an inorganic semiconductor is used. In an FET, the electric current across the drain and source electrodes is controlled by applying voltage to the gate electrode. However, since the organic semiconductor is less conductive than the inorganic semiconductor, an organic FET has fewer carriers induced in its active layer. Therefore, in order to form a channel in the active layer, it is necessary to inject carriers from the drain electrode and the source electrode.

In order to facilitate the injection of carriers from the drain electrode and the source electrode, an organic FET having interface layers (admolecule layers) each between an active layer and a drain electrode and between an active layer and a source electrode has been proposed (for example, see Patent Document 1). FIG. 8 shows a cross-sectional view of a prior-art organic FET disclosed in Patent Document 1.

A method for fabricating a prior-art organic FET is explained below with reference to FIG. 8. First, a 100-nm-thick film is formed on an insulating substrate 101 formed from a glass substrate by sputtering chromium, and then a gate electrode 102 is formed by photolithography. Second, a 300-nm-thick SiN layer is formed by CVD (chemical vapor deposition), and then a gate insulating film 103 is formed. Subsequently, after forming a resist pattern having an edge with an inverse-tapered shape, 1-nm-thick chromium and 100-nm-thick gold layers are sequentially deposited on the resist pattern, and a source electrode 104 and drain electrode 105 are formed by a lift-off method. Third, the resulting laminate is immersed into a 0.1 mMol/l octadecanethiol solution for 1 minute, and then an admolecule layer 701 is formed on the surfaces of the source electrode 104 and the drain electrode 105. The admolecule layer 701 has a structure wherein sulfur atoms are adhered to the electrode surfaces, and octadecanethiol molecules, which are obtained by desorbing the H in the mercapto group in octadecanethiol, are oriented to the surfaces of the electrodes. In the last step, a 50-nm-thick pentacene is evaporated in an atmosphere of $2.7 \times 10^{-4}$ Pa at a rate of 0.1 nm/s to form a semiconductor layer 106 that covers the gate insulating film and the admolecule layer.

The operation of the admolecule layer 701 in the organic FET is as follows. By forming the admolecule layer 701 on the surfaces of the source electrode 104 and the drain electrode 105, the water repellence of the electrode surface is improved and the grain of the semiconductor layer 106 is enlarged. If the immersion time is extended from one minute to one day, the contact angle used as a water-repellence index will change from 95° to 101°. When the immersion time is set to one day in order to improve the water repellence of the electrode surface, the electric current across the drain electrode and the source electrode is decreased by two orders of magnitude compared to an organic FET without the admolecule layer 701. This is because the thickness of the admolecule layer 701 is increased to approximately 2.3 nm, and the efficiency of carrier injection from the source electrode 104 to the semiconductor layer 106 via the admolecule layer 701 is decreased. When the immersion time is shortened to one minute, the thickness of the admolecule layer 701 will become 1 nm or less, and the carrier injection efficiency from the source electrode 104 to the semiconductor layer 106 will be improved. As is clear from the above, by placing an admolecule layer with a desirable thickness between a semiconductor layer and a source electrode and between a semiconductor layer and a drain electrode, the electric current across the drain electrode and the source electrode is increased. In other words, by employing the technique of Patent Document 1, the thickness of the admolecule layer is decreased by shortening the immersion time, and therefore the carrier injection efficiency is improved.

Patent Document 2 is related to the above-described technique.

[Patent Document 1] Japanese Unexamined Patent Publication No. 2005-93542 (in particular, pages 7 to 9)

[Patent Document 2] Japanese Unexamined Patent Publication No. 2005-223107 (in particular paragraph 0023)

DISCLOSURE OF THE INVENTION

Problem to Be Solved by the Invention

In the technique of Patent Document 1, however, since the immersion time has to be shortened in order to increase the carrier injection efficiency, the water repellence of the electrode surfaces is not significantly improved. Therefore, the grain of the semiconductor layer in the vicinity of the electrode interfaces is not very large, and this results in insufficient conductivity of the semiconductor layer.

For these reasons, in the technique of Patent Document 1, the ON-state current is increased only by approximately 50% compared to the case wherein an admolecule layer is not inserted. As described above, a satisfactory increase in the ON-state current cannot be obtained by prior art techniques. The present inventors also found that, when thiophenol or a like short molecule is used as the admolecule layer, the grain of the semiconductor layer in the vicinity of the electrode interface is not very large, and therefore the contact resistance is not satisfactorily reduced.

The present invention has been accomplished to solve the problems described above. In other words, an object of the present invention is to provide an organic FET having improved interfaces between the semiconductor layer and the source electrode/drain electrode by employing a novel technique that is different from conventional means, wherein the ON-state current is increased and the contact resistance is reduced.

Means for Solving the Problem

The present inventors conducted extensive research to achieve the above-described object, and found that the object can be achieved by placing a specific organic molecule layer (first organic molecule layer) on the top surfaces of the source electrode and the drain electrode, and then placing another organic molecule layer (second organic molecule layer) on the opposing side surfaces of the source electrode and the drain electrode.

The present invention relates to the following organic FETs and a method for fabricating the same.

1. An organic FET comprising:

a substrate;

a gate insulating film disposed on the substrate;

a metal source electrode and a metal drain electrode disposed on the gate insulating film in such a manner that they face each other in a horizontal direction; and an organic semiconductor layer covering the gate insulating film, the source electrode and the drain electrode;

(1) the first organic molecule layer being formed between the top surface of the source electrode and the semiconductor layer, and between the top surface of the drain electrode and the semiconductor layer;

(2) the second organic molecule layer being formed between the opposing side surface of the source electrode and the semiconductor layer, and between the opposing side surface of the drain electrode and the semiconductor layer;

(3) the first organic molecule layer consisting of an alkanethiol molecule that has a carbon number of at least 4 and that may have at least one substituent, and (4) the second organic molecule layer consisting of at least one-type of molecule selected from the group consisting of p-thiocresol molecules and thiophenol molecules.

2. An organic FET according to Item 1, wherein the carbon number in the alkanethiol molecule is from 4 to 12.

3. An organic FET according to Item 1, wherein the alkanethiol molecule is represented by Formula $C_nH_{2n+1}S$ where n is an integer from 4 to 12.

4. An organic FET according to Item 1, wherein the substrate is a gate electrode.

5. A method for fabricating an organic FET comprising:

Step 1 of disposing a metal source electrode and a metal drain electrode on a gate insulating film formed on a substrate in such a manner that they face each other in a horizontal direction;

Step 2 of forming a first organic molecule layer consisting of an alkanethiol molecule that has a carbon number of at least 4 and that may have at least one substituent on the surfaces of the source electrode and drain electrode;

Step 3 of removing first organic molecule layers each formed on the opposing side surfaces of the source electrode and the drain electrode by UV light irradiation;

Step 4 of forming a second organic molecule layer consisting of at least one member selected from the group consisting of p-thiocresol molecules and thiophenol molecules on the opposing side surfaces of the source electrode and drain electrode; and Step 5 of forming an organic semiconductor layer covering the gate insulating film, the first organic molecule layer, and the second organic molecule layer.

EFFECT OF THE INVENTION

The organic FET of the present invention has a first organic molecule layer on the top surfaces of the source and drain electrodes, and a second organic molecule layer on the side surfaces of the opposing two electrodes. This structure increases the ON-state current and reduces the contact resistance compared to a prior-art FET. The organic FET of the present invention is useful as a device that is drivable at a low voltage, etc., such as a wireless ID tag. The fabrication method of the present invention is suitable for obtaining such organic FETs.

BRIEF DESCRIPTION OF THE DRAWINGS

FIG. 8 shows a cross-sectional view of a prior-art organic FET (for example, that of Patent Document 1).

EXPLANATION OF REFERENCE NUMERALS

Figure 1:
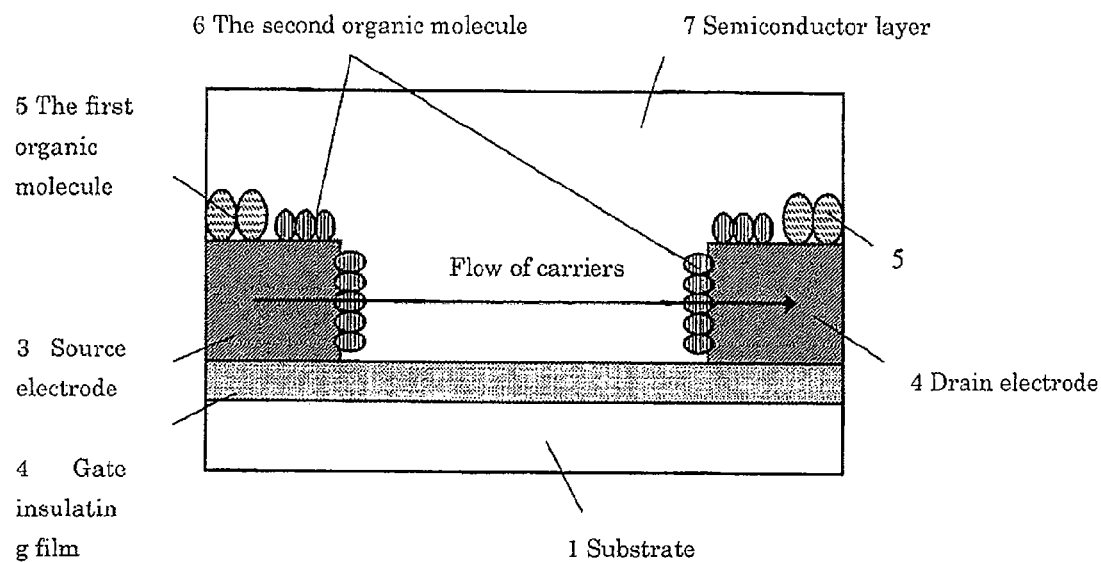
FIG. 1 is a cross-sectional view of the organic FET according to one embodiment of the present invention.

1 Substrate (that can also serve as a gate electrode)
2 Gate Insulating Film
3 Source Electrode
4 Drain Electrode
5 First Organic Molecule Layer
6 Second Organic Molecule Layer
7 Semiconductor Layer
21 Metal Mask
101 Insulating Substrate
102 Gate Electrode
103 Gate Insulating Film
104 Source Electrode
105 Drain Electrode 106 Semiconductor Layer
701 Admolecule Layer

BEST MODE FOR CARRYING OUT THE INVENTION

1. Organic FET

The organic FET of the present invention comprises:
a substrate;
a gate insulating film disposed on the substrate;
a metal source electrode and a metal drain electrode disposed on the gate insulating film in such a manner that they face each other in a horizontal direction; and
an organic semiconductor layer covering the gate insulating film, the source electrode and the drain electrode,
(1) a first organic molecule layer being formed between the top surface of the source electrode and the semiconductor layer, and between the top surface of the drain electrode and the semiconductor layer;
(2) a second organic molecule layer being formed between the opposing side surface of the source electrode and the semiconductor layer, and between the opposing side surface of the drain electrode and the semiconductor layer;
(3) the first organic molecule layer consisting of an alkanethiol molecule that has a carbon number of at least 4 and that may have at least one substituent; and
(4) the second organic molecule layer consisting of at least one-type of molecule selected from the group consisting of p-thiocresol molecules and thiophenol molecules.

In the organic FET of the present invention, a first organic molecule layer (a layer consisting of an alkanethiol molecule that has a carbon number of at least 4 and that may have at least one substituent) is formed between the top surface of the source electrode and the semiconductor layer and between the top surface of the drain electrode and the semiconductor layer, and a second organic molecule layer (a layer consisting of at least one-type of molecule selected from the group consisting of p-thiocresol molecules and thiophenol molecules) is formed between the opposing side surface of the source electrode and the semiconductor layer, and between the opposing side surface of the drain electrode and the semiconductor layer.

The first organic molecule layer has a greater hydrophobicity than that of the second organic molecule layer. This increases the grain of the semiconductor layer in the vicinity of the electrode interfaces and forms excellent contact between the electrodes and the semiconductor layer, and therefore increases the ON-state current and reduces the contact resistance.

The terms of "alkanethiol molecule", "p-thiocresol molecule", and "thiophenol molecule" in the present specification refer to molecules wherein a hydrogen atom (H) is desorbed from the mercapto group (—SH) in alkanethiol, p-thiocresol, and thiophenol respectively. For example, when alkanethiol is 1-butanethiol ($C_4H_9$—SH), the structure ($C_4H_9$—S—) wherein a hydrogen atom is desorbed from the mercapto group is referred to as a 1-butanethiol molecule.

In the present specification, the terms "alkanethiol", "p-thiocresol", and "thiophenol", which do not have the word "molecule" at the end are different from the above terms, and indicate the status of having a hydrogen atom (H) not desorbed from the mercapto group (—SH). According to this definition, the terms "alkanethiol solution", "p-cresol solution", and "thiophenol solution" indicate solutions in which alkanethiol, p-cresol, and thiophenol are dissolved in a solvent respectively.

There is no other structural limitation to the organic FET of the present invention as long as the first organic molecule layer and the second organic molecule layer meet the above requirements. In other words, there are no limitations to the substrate, gate insulating film, source electrode, drain electrode, organic semiconductor layer, etc., which form the organic FET, and generally employed components can be used for these without modification.

The present invention is described in detail below with reference to the drawings.

Figure 2:
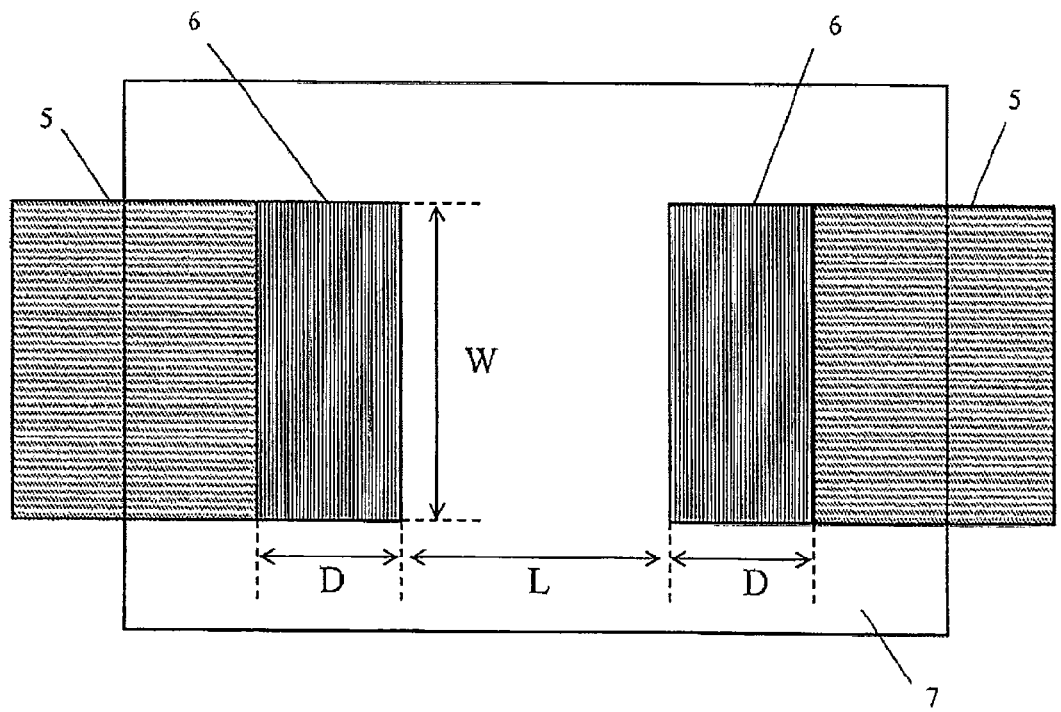
FIG. 2 is a top view of the organic FET according to one embodiment of the present invention.

FIG. 1 is a cross-sectional view of an organic FET according to one embodiment of the present invention. FIG. 2 is a top view of an organic FET according to one embodiment of the present invention.

In FIG. 1, 1 indicates a substrate, 2 indicates a gate insulating film, 3 indicates a source electrode, 4 indicates a drain electrode, 5 indicates a first organic molecule layer, 6 indicates a second organic molecule layer, and 7 indicates a semiconductor layer. The embodiment shown in FIG. 1 is a bottom-contact FET, wherein the source electrode 3 and the drain electrode 4 are disposed on the bottom portion of the semiconductor layer 7. However, the present invention is not limited to this embodiment.

There are no limitations to the substrate 1 and an Si substrate or the like can be used. When an Si substrate is used, by doping n-type impurities, the substrate 1 can be used as a gate electrode without applying any further process. For example, an Si substrate to which approximately $1 \times 10^{20}/cm^3$ arsenic (As) has been doped can be used as the substrate 1. The substrate 1 can also be obtained by forming a gate electrode on a substrate that is free from impurities by patterning.

A thermally oxidized film is generally used as the gate insulating film 2. In other words, when an Si substrate is used, $SiO_2$ can be used as the gate insulating film 2. Instead of the thermally oxide film, p-TEOS (p-tetraethoxysilane) and an insulating film of $SiO_2$, polyimide or the like formed by sputtering may be used.

The source electrode 3 and the drain electrode 4 are formed of a metal. For example, the source electrode 3 and the drain electrode 4 may have a structure wherein Cr is used as an adhesion layer, Au is used as an electrode layer, and these metal layers are sequentially laminated. It is also possible to form the source electrode 3 and the drain electrode 4 using Ti as an adhesion layer and Pd, Pt, or Ag as an electrode layer. The source electrode 3 and drain electrode 4 are disposed on the surface of the gate insulating film 2 in such a manner that they oppose each other in a horizontal direction.

As described below, a first organic molecule layer 5 and a second organic molecule layer 6 are formed on the surfaces of the source electrode 3 and the drain electrode 4, and a semiconductor layer 7 is formed so as to cover the source electrode 3, the drain electrode 4, and the gate insulating film 2. More specifically, a first organic molecule layer 5 is formed between the top surface of the source electrode 3 and the semiconductor layer 7, and between the top surface of the drain electrode 4 and the semiconductor layer 7. A second organic molecule layer 6 is formed between the opposing side surface of the source electrode 3 and the semiconductor layer 7 and between the opposing side surface of the drain electrode 4 and the semiconductor layer 7.

The first organic molecule layer 5 consists of alkanethiol that has a carbon number of at least 4 and that may have at least one substituent. The carbon number of the alkanethiol molecule is not limited as long as it is not less than 4, but the preferable upper limit is approximately 12 and more preferably approximately 10. In other words, the carbon number is preferably from 4 to 12, and more preferably from 4 to 10. If the alkanethiol molecule is expressed as "R—S—", such a molecule forms a self-organized film that is oriented to the electrode surface in an embodiment of an R—S-electrode (metal).

A preferable alkanethiol molecule is expressed by Formula $C_nH_{2n+1}S$ wherein n is an integer within the range of 4 to 12. Preferable examples thereof include a 1-butanethiol molecule, a decanethiol molecule and like alkanethiol molecules.

There are no limitations to the thickness of the first organic molecule layer 5, but the thickness is preferably approximately 0.5 to 2 nm, and more preferably approximately 0.6 to 1.6 nm.

The second organic molecule layer consists of at least one-type of molecule selected from the group consisting of p-thiocresol molecules and thiophenol molecules. These molecules are thiol compound molecules which have $\pi$ conjugated bonds. The second organic molecule layer 6 is a self-organized film similar to the first organic molecule layer 5. If the thiol compound molecule is expressed as "$R^1$—S—", such a molecule forms a self-organized film with being oriented to the electrode surface in an embodiment of an $R^1$—S-electrode (metal).

There are no limitations to the thickness of the second organic molecule layer 6, but preferably it falls within the range of approximately 0.3 to 1 nm, and more preferably approximately 0.5 to 0.7 nm.

It is preferable that the first organic molecule layer 5 be formed only on the top surfaces of the source electrode 3 and the drain electrode 4. It is also preferable that the second organic molecule layer 6 be formed only on the opposing side surfaces of the source electrode 3 and the drain electrode 4. Depending on the method for forming the organic molecule layers 5 and 6, some portion of the second organic molecule layer 6 is inevitably formed also on the top surfaces of the source electrode 3 and the drain electrode 4, but such partial formation of the second organic molecule layer 6 is allowed. More specifically, the second organic molecule layer 6 is partially formed also on the top surfaces of the source electrode 3 and the drain electrode 4 in FIG. 1, but such inevitable partial formation of the second organic molecule layer 6 falls within the scope of the present invention.

The semiconductor layer 7 is formed in such a manner that it covers the gate insulating film 2, the first organic molecule layer 5 and the second organic molecule layer 6. One example of the semiconductor layer 7 is pentacene, which is a p-type organic semiconductor. It is also possible to use other organic semiconductor materials that can transmit carriers.

In FIG. 2, L indicates gate length, W indicates gate width, and D indicates the width of the second organic molecule layer 6 partially formed on the top surfaces of the source electrode 3 and the drain electrode 4. The ranges of these may be, for example, approximately 30 to 500 µm for L, approximately 1 mm for W, and approximately 200 µm for D. D is the length of the second organic molecule layer 6 in the portion which lies on the top surfaces of the electrodes, and therefore it is preferable to make D as small as possible, and 0 is the most preferable.

Positive holes, which function as carriers, are injected into the semiconductor layer 7 from the source electrode 3 via the second organic molecule layer 6 as shown by the arrow in FIG. 1. This forms a channel layer in the semiconductor layer 7 in the vicinity of the gate insulating film 2. The positive holes reach the drain electrode 4 through the channel layer. Due to the first organic molecule layer 5, the grain of the semiconductor layer 7 in the vicinity of the electrode interfaces is enlarged and the carrier transmission is improved.

The second organic molecule layer 6 is covalently bonded to the source electrode 3 and the drain electrode 4, and has a $\pi$ conjugated bond, and therefore excellent contact is obtained between the second organic molecule layer 6 and the semiconductor layer 7. Accordingly, when the grain of the semiconductor layer 7 in the vicinity of the electrode interfaces is enlarged due to the first organic molecule layer 5, the ON-state current is increased. Furthermore, the contact resistance is reduced by the increase in the grain size of the semiconductor layer 7, and the efficiency of the carrier injection from the source electrode 3 into the semiconductor layer 7 is improved due to the excellent contact formed between the second organic molecule layer 6 and the semiconductor layer 7, which is attributable to the second organic molecule layer 6.

2. Method for Fabricating an Organic FET

The organic FET of the present invention can ideally be obtained by the method for fabricating an organic FET described below.

A method for fabricating an organic FET comprising:

Step 1 of disposing a metal source electrode and a metal drain electrode on a gate insulating film that is formed on a substrate in such a manner that they face each other in a horizontal direction;

Step 2 of forming a first organic molecule layer consisting of an alkanethiol molecule that has a carbon number of at least 4 and that may have at least one substituent on the surfaces of the source electrode and the drain electrode;

Step 3 of removing the first organic molecule layers each formed on the opposing side surfaces of the source electrode and the drain electrode by UV light irradiation;

Step 4 of forming a second organic molecule layer consisting of at least one member selected from the group consisting of p-thiocresol molecules and thiophenol molecules on the side opposing to the surfaces of the source electrode and drain electrode; and Step 5 of forming an organic semiconductor layer covering the gate insulating film, the first organic molecule layer, and the second organic molecule layer.

Figure 3:
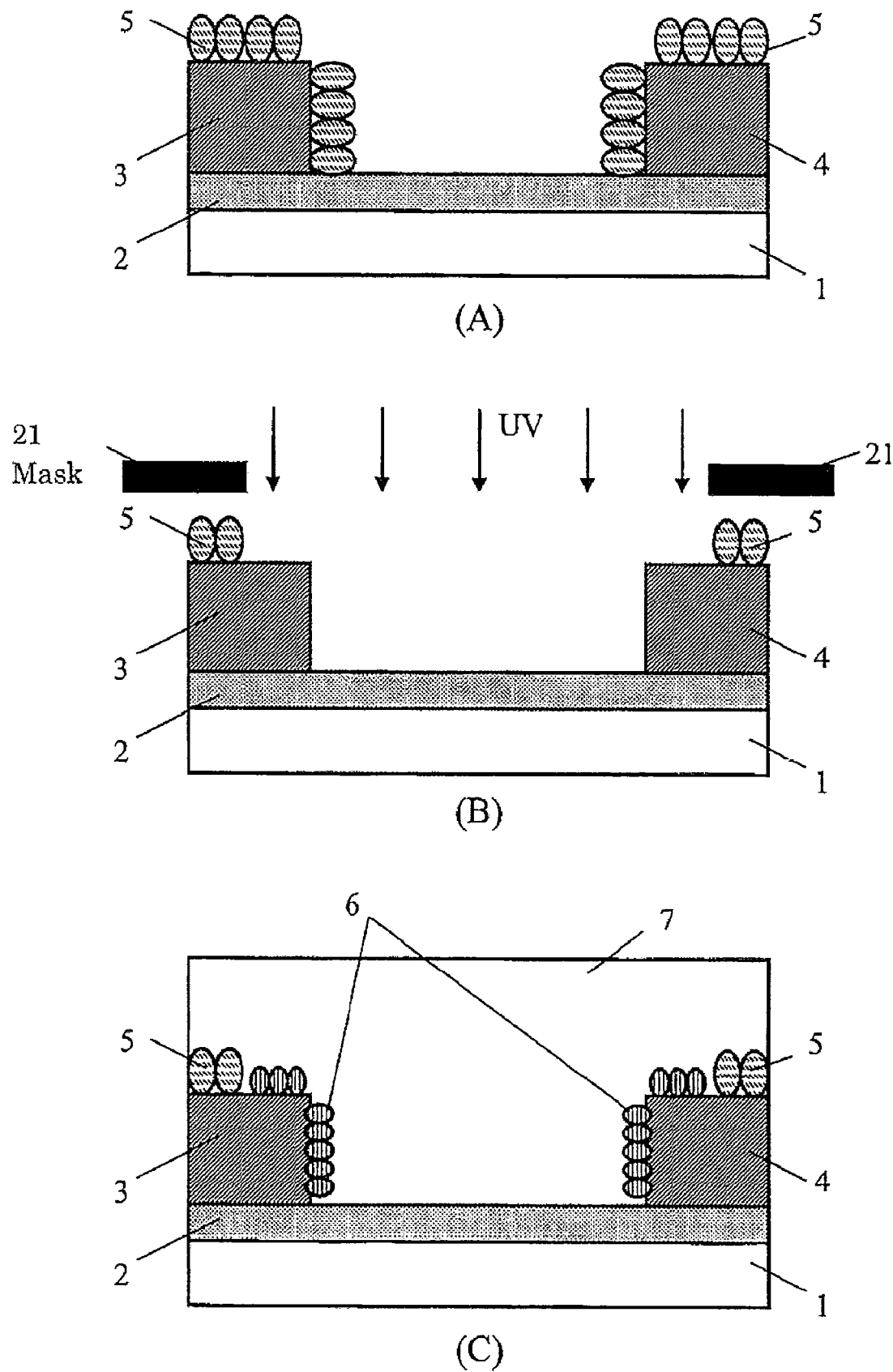
FIG. 3(A)-3(C) illustrate the process for fabricating the organic FET of the present invention.

The main feature of the fabrication method of the present invention lies in the steps of forming the first organic molecule layer and the second organic molecule layer on the surfaces of the gate electrode and the drain electrode (especially, Steps 2 to 4). The fabrication method is explained below with reference to FIG. 3. FIG. 3 is a flow chart showing one example of a method for fabricating an organic FET. Descriptions of the substrate, gate insulating film, source electrode, drain electrode, organic semiconductor layer, first organic molecule layer, and second organic molecule layer are omitted here, because they are the same as those described above.

Step 1

In Step 1, a source electrode 3 formed of a metal and a drain electrode 4 formed of a metal are arranged on a gate insulating film 2 disposed on the surface of the substrate 1 in such a manner that they face each other in a horizontal direction.

For example, an Si substrate to which n-type impurities have been doped is prepared as a substrate 1. This substrate also serves as a gate electrode. By oxidizing the surface of the substrate 1, $SiO_2$ is formed to obtain a gate insulating film 2. For example, an oxide layer is formed by oxidizing the surface of substrate 1 in an oxidizing atmosphere of approximately 1,000° C. The thickness of the gate dielectric film 2 is, for example, 215 nm.

A Cr film adhesion layer and then an Au film electrode layer are formed on the gate insulating film 2 through a metal mask by vapor deposition, and a source electrode 3 and a drain electrode 4 patterned into a desirable form are obtained. The source electrode 3 and the drain electrode 4 are arranged on the gate insulating film 2 in such a manner that they face each other in a horizontal direction. The thickness of the electrode, for example, is approximately 1 nm for the Cr layer, and approximately 150 nm for the Au layer.

Step 2

In Step 2, on the surfaces of the source electrode 3 and drain electrode 4, a first organic molecule layer 5 consisting of an alkanethiol molecule that has a carbon number of at least 4 and that may have at least one substituent is formed.

The first organic molecule layer 5 is formed by, for example, immersing the laminate in a 1-butanethiol solution of approximately 0.01 g/l using ethanol as a solvent for approximately 3 hours. The immersion time is not limited to the above and can be suitably selected from 1 to 6 hours. The first organic molecule layer 5 is formed on the entire surfaces of the source electrode 3 and the drain electrode 4 (FIG. 3(A)). The 1-butanethiol molecules are bonded to the electrode (metal) surface due to a thiol bond, and therefore they are not formed on the gate insulating film 2.

Step 3

In Step 3, by irradiating the opposing side surfaces of the source electrode 3 and the drain electrode 4 with ultraviolet light, the first organic molecule layer 5 formed on the opposing side surfaces is removed.

More specifically, in Step 3, for example, using a metal mask 21 and an ultraviolet transmission and visible light absorption filter, the opposing side surfaces of the source electrode 3 and the drain electrode 4 are irradiated with approximately 2.3 mW/cm$^2$ of ultraviolet light for approximately 30 minutes (FIG. 3 (B)). Thereafter, the metal mask 21 is removed, and the region irradiated with ultraviolet light is washed with ethanol so that the first organic molecule layer 5 in said region is removed (FIG. 3(B)). The removal of thiol compound molecules bonded to metal by employing ultraviolet light irradiation is disclosed in, for example, Non-Patent Document (J. Hang and J. C. Hemminger, J. Am. Chem. Soc. 1993, 115, 3342-3343).

It is desirable that the removal of the first organic molecule layer 5 formed on the top surfaces of the electrodes be avoided as much as possible by accurately controlling the arrangement of the metal mask 21. However, the unavoidable removal of a portion of the first organic molecule layer 5 is allowed.

Step 4

In Step 4, a second organic molecule layer 6 consisting of at least one type of molecule selected from the group consisting of p-thiocresol molecules and thiophenol molecules is formed on the opposing side surfaces of the source electrode 3 and the drain electrode 4.

More specifically, in Step 4, the second organic molecule layer 6 is formed on the region where the first organic molecule layer 5 is removed in Step 3 by, for example, immersing the laminate in a solution of approximately 0.01 g/l p-thiocresol using ethanol as a solvent for approximately 3 hours. The immersion time is not limited to the above and can be suitably selected from 1 to 6 hours. p-Thiocresol molecules are bonded to the surfaces of the electrodes (metal) by a thiol bond, and therefore they are not formed on the gate insulating film 2 (FIG. 3 (C)).

Step 5

In Step 5, an organic semiconductor layer 7 is formed in such a manner that it covers the gate insulating film 2, the first organic molecule layer 5, and the second organic molecule layer 6.

In Step 5, for example, pentacene is deposited on the surface of the laminate in an atmosphere of $1.4 \times 10^{-4}$ Pa, at a rate of 0.03 nm/s and to a thickness of approximately 50 nm, thus forming a semiconductor layer 7

After conducting the above-described steps, the organic FET of the present invention is obtained. As long as the requirements for the first and second organic molecule layers described above are met, other materials and/or conditions may be employed to fabricate the organic FET of the present invention.

EXAMPLES

Examples, Reference Examples, Comparative Examples and Comparative Reference Examples are described below to facilitate the understanding of the present invention.

Example 1 and Reference Example 1

(Fabrication of Organic FET)

Two Si substrates, which serve also as gate electrodes, to which n-type impurities (arsenic) had been doped at a concentration of approximately $1 \times 10^{20}/cm^3$ were prepared as substrates 1$a$ and 1$b$.

The two substrates were placed in a vacuum chamber, and then on the surfaces of the substrates 1$a$ and 1$b$, a 215-nm-thick thermally oxide film was formed to obtain a gate insulating film 2.

An approximately 1-nm-thick Cr film and an approximately 150-nm-thick Au film were sequentially formed through a mask, thus forming a source electrode 3, and a drain electrode 4.

Thereafter, the substrates 1$a$ and 1$b$ were removed from the vacuum chamber.

Subsequently, by immersing the substrate 1$a$ in a 1-butanethiol solution of approximately 0.01 g/l using ethanol as a solvent for approximately 3 hours, a first organic molecule layer 5 consisting of 1-butanethiol molecules was formed on the surfaces of the source electrode 3 and the drain electrode 4. The average thickness of the first organic molecule layer 5 was approximately 0.6 nm.

After providing a metal mask 21, approximately 2.3 mW/cm$^2$ of ultraviolet light was irradiated for approximately 30 minutes (FIG. 3(B)). Such irradiation was conducted through an ultraviolet transmission and visible light absorption filter (product of HOYA, U340), mainly towards the opposing side surfaces of the source electrode and the drain electrode.

After removing the metal mask 21, washing with ethanol was conducted, thereby removing the first organic molecule layer 5 only from the region irradiated with ultraviolet light.

By immersing the substrate 1$a$ in a p-thiocresol solution of approximately 0.01 g/l obtained by using ethanol as a solvent for approximately 3 hours, the regions of the surfaces of the source electrode 3 and drain electrode 4 from which the first organic molecule layer 5 was removed, i.e., the opposing side surfaces of the source electrode and the drain electrode, a second organic molecule layer 6 consisting of p-thiocresol molecules was formed.

By immersing the substrate 1$b$ in a p-thiocresol solution of approximately 0.01 g/l using ethanol as a solvent for approximately 3 hours, an admolecule layer 701 consisting of p-thiocresol molecules was formed on the entire surfaces of the source electrode 104 and the drain electrode 105 (see, FIG. 8).

These substrates 1a and 1b were placed in the vacuum chamber again, and then pentacene was deposited in an atmosphere of approximately $1.4\times10^{-4}$ Pa, at a rate of approximately 0.03 nm/s, and to a thickness of approximately 50 nm. The semiconductor layer 7 and semiconductor layer 106 were thus formed.

Here, the gate length L was changed from 30 μm to 500 μm, the gate width W was fixed to 1 mm, and the width D of the second organic molecule layer 6 formed on the top surfaces of the electrodes was set at 200 μm.

By following the above process, the organic FET was fabricated. The case where the substrate 1a was used is referred to as Example 1, and the case where the substrate 1b was used is referred to as Reference Example 1.

(Evaluation of the Performance of the Organic FETs)

The performance of the organic FETs obtained in Example 1 and Reference Example 1 were evaluated.

Figure 4:
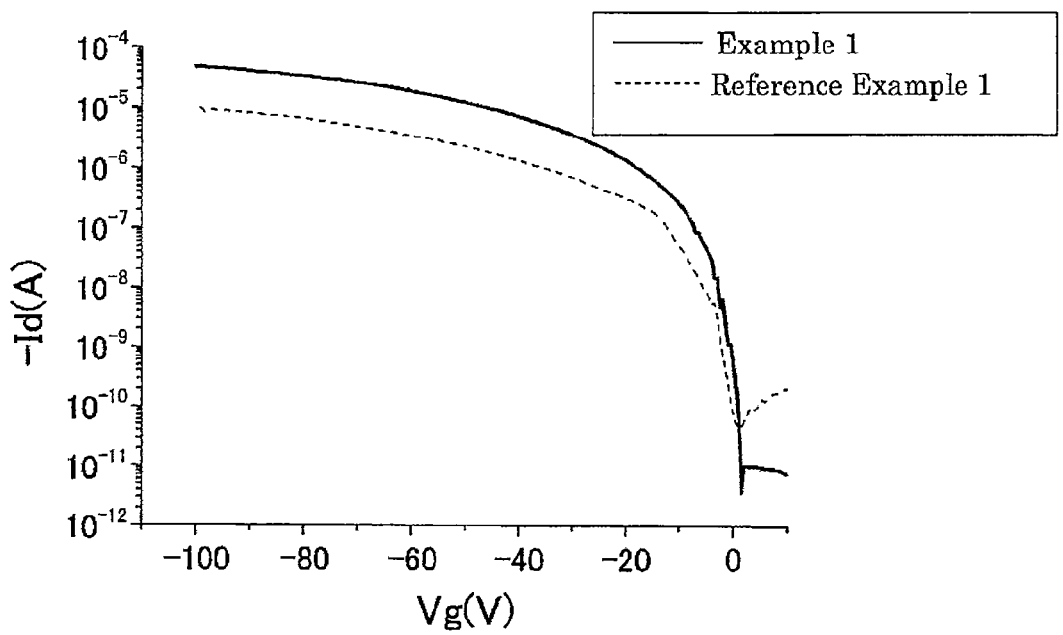
FIG. 4 shows the characteristics of the devices used in Example 1 and Reference Example 1.

FIG. 4 illustrates the characteristics of the organic FETs in Example 1 and Reference Example 1. FIG. 4 shows the drain currents Id in the organic FETs having L=200 μm, voltage across the drain and source electrodes Vds=−100 V, and voltage across the gate and source electrodes Vgs being changed from +10 to −100 V.

The ON-state current was $3.42\times10^{-5}$ A in Example 1 and $6.59\times10^{-6}$ A in Reference Example 1. (The ON-state current was defined as the drain current when Vgs=−80 V.)

The mobility was calculated based on the inclination of $\sqrt{Id}$–Vgs. The mobility in Example 1 was 0.14 $cm^{-2}/Vs$ and that in Reference Example 1 was 0.027 $cm^{-2}/Vs$.

As is clear from the results, the organic FET having improved electrode interfaces (Example 1) exhibited an ON-state current and mobility both enhanced by approximately 5 times compared to those of the prior-art organic FET (Reference Example 1).

Figure 5:
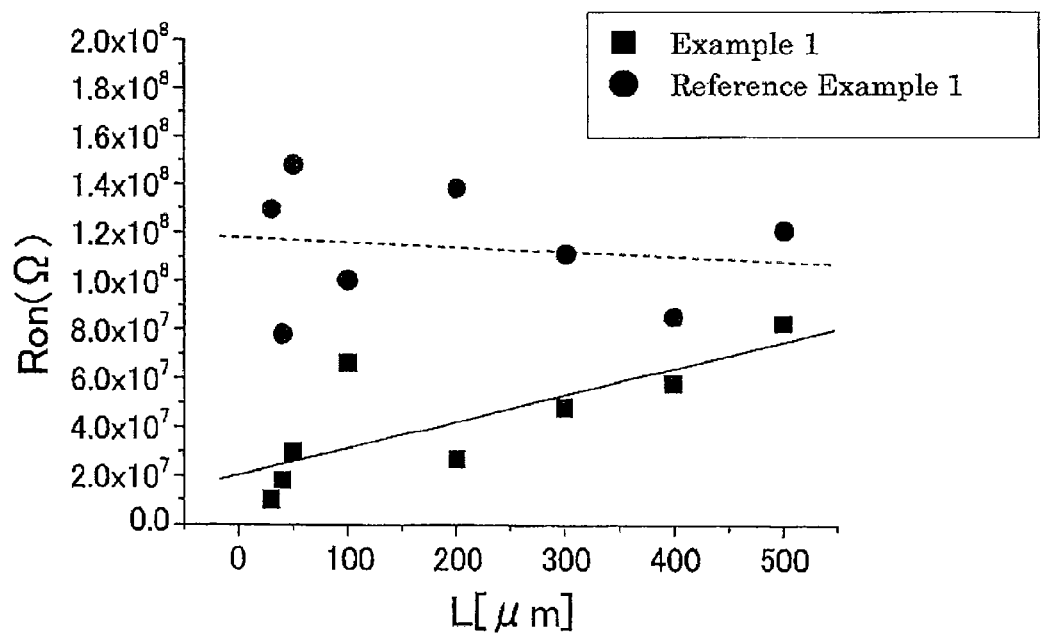
FIG. 5 shows the contact resistances of Example 1 and Reference Example 1.

FIG. 5 shows the contact resistance in the organic FETs of Example 1 and Reference Example 1. In FIG. 5, the voltage across drain and source electrodes (Vds=−100 V) was divided by the drain current Id (when Vgs=−30 V) to obtain ON-state resistance Ron, and then the obtained ON-state resistances Ron were plotted according to the channel length (gate length) L.

In both Example 1 and Reference Example 1, the vertical axis intercept can be obtained by drawing an approximation line. The value of the thus-obtained vertical axis intercept indicates the contact resistance.

The contact resistance was $2.03\times10^{-7}\Omega$ in Example 1 and $1.18\times10^{-8}\Omega$ in Reference Example 1.

Accordingly, it is clear that the contact resistance was reduced to approximately 1/5 in the organic FET having improved electrode interfaces (Example 1) compared to that of the prior-art organic FET (Reference Example 1).

Example 2 and Reference Example 2

An organic FET was fabricated using the same process as that described in Example 1 and Reference Example 1 except that a 1-pentanethiol solution was used as the solution for forming the first organic molecule layer 5.

The case where the substrate 1a was used is defined as Example 2, and the case where the substrate 1b was used is defined as Reference Example 2.

Example 3 and Reference Example 3

An organic FET was fabricated using the same process as that described in Example 1 and Reference Example 1 except that a decanethiol solution was used as the solution for forming the first organic molecule layer 5.

The case where the substrate 1a was used is defined as Example 3, and the case where the substrate 1b was used is defined as Reference Example 3.

Reference Example 1 and Comparative Reference Example 1

An organic FET was fabricated using the same process as that described in Example 1 and Reference Example 1 except that a propanethiol solution was used as the solution for forming the first organic molecule layer 5.

The case where the substrate 1a was used is defined as Comparative Example 1, and the case where the substrate 1b was used is defined as Comparative Reference Example 1.

Example 4 and Reference Example 4

An organic FET was fabricated using the same process as that described in Example 1 and Reference Example 1 except that a 1-butanethiol solution was used as the solution for forming the first organic molecule layer 5 and a thiophenol solution was used as the solution for forming the second organic molecule layer 6.

The case where the substrate 1a was used is defined as Example 4, and the case where the substrate 1b was used is defined as Reference Example 4.

Example 5 and Reference Example 5

An organic FET was fabricated using the same process as that described in Example 1 and Reference Example 1 except that a 1-pentanethiol solution was used as the solution for forming the first organic molecule layer 5 and a thiophenol solution was used as the solution for forming the second organic molecule layer 6.

The case where the substrate 1a was used is defined as Example 5, and the case where the substrate 1b was used is defined as Reference Example 5.

The performance of each of the above-obtained organic FETs was evaluated. The evaluation results (ON-state current, mobility, and contact resistance) are shown in Table 1 below.

TABLE 1

|  | ON-state current (A) | Mobility ($cm^{-2}/Vs$) | Contact resistance ($\Omega$) |
| --- | --- | --- | --- |
| Example 1 | 3.42E−05 | 0.14 | 2.03E+07 |
| Reference Example 1 | 6.59E−06 | 0.027 | 1.18E+08 |
| Example 2 | 3.85E−05 | 0.11 | 7.36E+06 |
| Reference Example 2 | 1.75E−05 | 0.052 | 3.69E+07 |
| Example 3 | 1.25E−05 | 0.043 | 3.66E+07 |
| Reference Example 3 | 7.58E−06 | 0.021 | 1.25E+08 |
| Comparative Example 1 | 7.62E−06 | 0.022 | 1.05E+08 |
| Comparative Reference Example 1 | 7.99E−06 | 0.023 | 5.58E+07 |
| Example 4 | 2.97E−05 | 0.13 | 6.77E+06 |
| Reference Example 4 | 1.79E−05 | 0.069 | 1.18E+07 |
| Example 5 | 2.03E−05 | 0.075 | 1.27E+07 |
| Reference Example 5 | 9.27E−06 | 0.034 | 3.55E+07 |

Comparison of performance was conducted using organic FETs fabricated in the same batch (i.e., in the same vacuum chamber). In other words, comparisons were made between the organic FET of Example 2 and that of Reference Example 2; Example 3 and Reference Example 3; Comparative Example 1 and Comparative Reference Example 1; Example 4 and Reference Example 4; and Example 5 and Reference Example 5.

The comparison results of the ON-state current are as given below. The ON-state current was measured using the same method as in Example 1 and Reference Example 1 and defined as the drain current when Vgs=−80 V.

The ON-state current was $3.85 \times 10^{-5}$ A in Example 2 and $1.75 \times 10^{-5}$ A in Reference Example 2.

The ON-state current was $1.25 \times 10^{-5}$ A in Example 3 and $7.58 \times 10^{-6}$ A in Reference Example 3.

The ON-state current was $7.62 \times 10^{-6}$ in Comparative Example 1A and $7.99 \times 10^{-6}$ A in Comparative Reference Example 1.

The ON-state current was $2.97 \times 10^{-5}$ A in Example 4 and $1.79 \times 10^{-5}$ A in Reference Example 4.

The ON-state current was $2.03 \times 10^{-5}$ A in Example 5 and $9.27 \times 10^{-6}$ A in Reference Example 5.

The comparison results of mobility are as given below.

The mobility was measured using the same method as in Example 1 and Reference Example 1.

The mobility was 0.11 $cm^{-2}/Vs$ in Example 2 and 0.052 $cm^{-2}/Vs$ in Reference Example 2.

The mobility was 0.043 $cm^{-2}/Vs$ in Example 3 and 0.021 $cm^{-2}/Vs$ in Reference Example 3.

The mobility was 0.022 $cm^{-2}/Vs$ in Comparative Example 1 and 0.023 $cm^{-2}/Vs$ in Comparative Reference Example 1.

The mobility was 0.13 $cm^{-2}/Vs$ in Example 4 and 0.069 $cm^{-2}/Vs$ in Reference Example 4.

The mobility was 0.075 $cm^{-2}/Vs$ in Example 5 and 0.034 $cm^{-2}/Vs$ in Reference Example 5.

The comparison results of contact resistance are as given below. The contact resistance was measured using the same method as in Example 1 and Reference Example 1.

The contact resistance was $7.36 \times 10^{-6} \Omega$ in Example 2 and $3.69 \times 10^{-7} \Omega$ in Reference Example 2.

The contact resistance was $3.66 \times 10^{-7} \Omega$ in Example 3 and $1.25 \times 10^{-8} \Omega$ in Reference Example 3.

The contact resistance was $1.05 \times 10^{-8} \Omega$ in Comparative Example 1 and $5.58 \times 10^{-7} \Omega$ in Comparative Reference Example 1.

The contact resistance was $6.77 \times 10^{-6} \Omega$ in Example 4 and $1.18 \times 10^{-7} \Omega$ in Reference Example 4.

The contact resistance was $1.27 \times 10^{-7} \Omega$ in Example 5 and $3.55 \times 10^{-7} \Omega$ in Reference Example 5.

As is clear from the results, the organic FETs in Examples 2, 3, 4, and 5 having improved electrode interfaces exhibited ON-state current and mobility that were increased to approximately two times and contact resistance that was reduced to approximately 1/5 to 1/3 compared to those of prior art organic FETs.

However, the organic FET of Comparative Example 1 exhibited an ON-state current and mobility that were reduced by approximately 5% and a contact resistance that was increased approximately 2 times compared to those of prior art organic FET (Comparative Reference Example 1).

From those results, it became clear that when a solution of alkanethiol with a chain length longer than that of 1-butanethiol (carbon number: 4) was used as the solution for forming the first organic molecule layer, the ON-state current and mobility increased and the contact resistance decreased compared to the Reference Examples.

Figure 6:
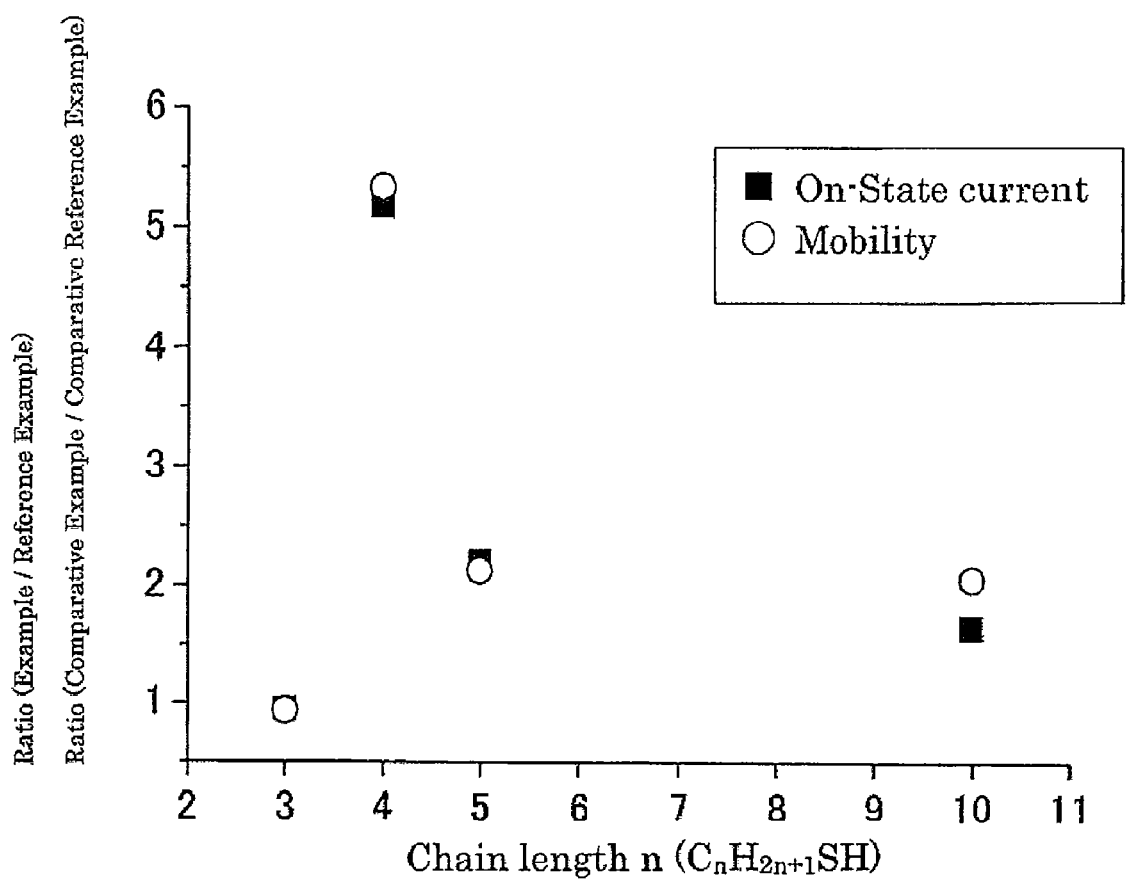
FIG. 6 shows the ratio of the ON-state current and mobility of Examples 1 to 3 to those of Reference Examples 1 to 3, and the ratio of the ON-state current and mobility of Comparative Example 1 to those of Comparative Reference Example 1.

FIG. 6 shows the ratio of ON-state current and mobility of Examples 1 to 3 to those of Reference Examples 1 to 3. FIG. 6 also shows the ratio of ON-state current and mobility of Comparative Example 1 to those of Comparative Reference Example 1.

Figure 7:
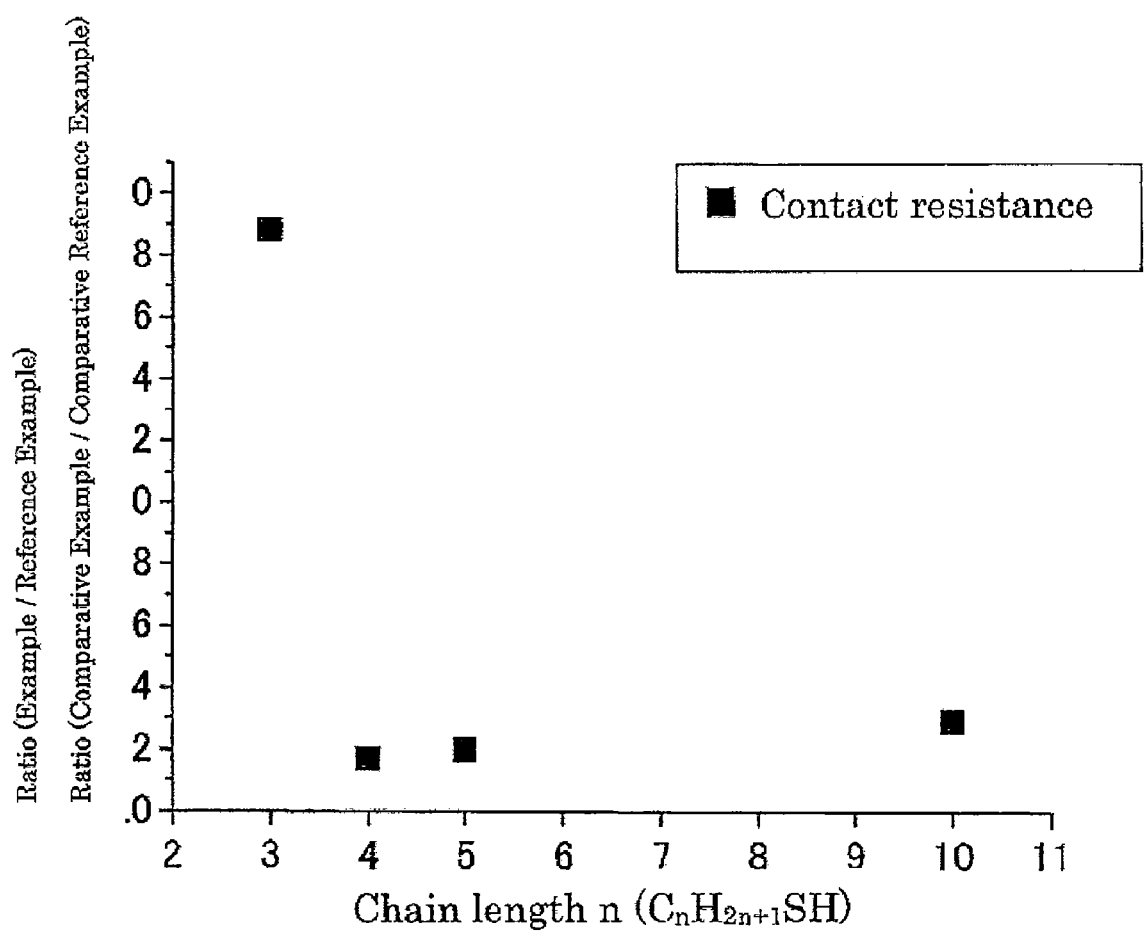
FIG. 7 shows the ratio of the contact resistance of Examples 1 to 3 to that of Reference Examples 1 to 3, and the ratio of the contact resistance of Comparative Example 1 to that of Comparative Reference Example 1.

FIG. 7 shows the contact resistance ratio of Examples 1 to 3 compared to Reference Examples 1 to 3, and the contact resistance ratio of Comparative Example 1 compared to Comparative Reference Example 1.

As is clear from FIGS. 6 and 7, when a solution of propanethiol with a chain length shorter than that of 1-butanethiol (carbon number: 4), the ON-state current and mobility decreased and the contact resistance increased compared to the Reference Examples.

The reason for this is that because the chain length of the molecules forming the first organic molecule layer is short, the grain of the semiconductor layer in the vicinity of the electrode interface did not become sufficiently large.

Accordingly, the solution for use in forming the first organic molecule layer should be a solution of alkanethiol with a chain length longer than that of 1-butanethiol (carbon number: 4).

The same results were obtained when a p-thiocresol solution or a thiophenol solution was used for forming the second organic molecule layer.

Accordingly, the solution for forming the second organic molecule layer should be a p-thiocresol solution and/or a thiophenol solution.

The invention claimed is:

1. An organic FET comprising:
   a substrate;
   a gate insulating film disposed on the substrate;
   a metal source electrode and a metal drain electrode disposed on the gate insulating film in such a manner that they face each other in a horizontal direction; and
   an organic semiconductor layer covering the gate insulating film, the source electrode and the drain electrode;
   (1) a first organic molecule layer being formed between the top surface of the source electrode and the semiconductor layer, and between the top surface of the drain electrode and the semiconductor layer;
   (2) a second organic molecule layer being formed between the opposing side surfaces of the source electrode and the semiconductor layer, and between the opposing side surfaces of the drain electrode and the semiconductor layer;
   (3) the first organic molecule layer consisting of an alkanethiol molecule that has a carbon number of at least 4 and that may have at least one substituent; and
   (4) the second organic molecule layer consisting of at least one-type of molecule selected from the group consisting of p-thiocresol molecules and thiophenol molecules.

2. The organic FET according to claim 1, wherein the carbon number in the alkanethiol molecule is from 4 to 12.

3. The organic FET according to claim 1, wherein the alkanethiol molecule is represented by Formula $C_nH_{2n+1}S$ where n is an integer from 4 to 12.

4. The organic FET according to claim 1, wherein the substrate is a gate electrode.

5. A method for fabricating an organic FET comprising:
   Step 1 of disposing a metal source electrode and a metal drain electrode on a gate insulating film formed on a substrate in such a manner that they face each other in a horizontal direction;
   Step 2 of forming a first organic molecule layer consisting of an alkanethiol molecule that has a carbon number of at least 4 and that may have at least one substituent on the surfaces of the source electrode and drain electrode;

Step 3 of removing first organic molecule layer portions each formed on the opposing side surfaces of the source electrode and the drain electrode by UV light irradiation;

Step 4 of forming a second organic molecule layer consisting of at least one member selected from the group consisting of p-thiocresol molecules and thiophenol molecules on the opposing side surfaces of the source electrode and drain electrode; and Step 5 of forming an organic semiconductor layer covering the gate insulating film, the first organic molecule layer, and the second organic molecule layer.

* * * * *